United States Patent
Li et al.

(10) Patent No.: US 10,103,157 B2
(45) Date of Patent: Oct. 16, 2018

(54) NONVOLATILE MEMORY HAVING A SHALLOW JUNCTION DIFFUSION REGION

(71) Applicant: eMemory Technology Inc., Hsin-Chu (TW)

(72) Inventors: Chun-Hsiao Li, Hsinchu County (TW); Wei-Ren Chen, Pingtung County (TW); Wein-Town Sun, Taoyuan (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/648,464

(22) Filed: Jul. 13, 2017

(65) Prior Publication Data

US 2018/0019252 A1 Jan. 18, 2018

Related U.S. Application Data

(60) Provisional application No. 62/362,068, filed on Jul. 14, 2016.

(51) Int. Cl.
*H01L 27/11* (2006.01)
*H01L 29/06* (2006.01)
(Continued)

(52) U.S. Cl.
CPC ......... *H01L 27/11524* (2013.01); *G11C 7/04* (2013.01); *G11C 7/109* (2013.01); *G11C 7/1084* (2013.01); *G11C 16/12* (2013.01); *H01L 21/326* (2013.01); *H01L 23/528* (2013.01); *H01L 27/11526* (2013.01); *H01L 27/11548* (2013.01); *H01L 29/0646* (2013.01); *H01L 29/0688* (2013.01); *H01L 29/0847* (2013.01); *H01L 29/1095* (2013.01); *H01L 29/36* (2013.01); *H01L 29/788* (2013.01); *H01L 29/7833* (2013.01); *H02M 3/073* (2013.01); *G11C 16/0433* (2013.01); *H02M 2001/007* (2013.01); *H05K 999/99* (2013.01)

(58) Field of Classification Search
CPC ......... H01L 27/11548; H01L 27/11524; H01L 27/11526; H01L 29/0646; H01L 29/0688; H01L 29/0847; H01L 29/1095; H01L 29/36; H01L 29/7833; H01L 29/788
See application file for complete search history.

(56) References Cited

U.S. PATENT DOCUMENTS

| | | | |
|---|---|---|---|
| 7,473,944 B2 * | 1/2009 | Kuriyama | H01L 27/1463 257/223 |
| 7,968,926 B2 * | 6/2011 | Huang | G11C 16/0441 257/300 |

(Continued)

*Primary Examiner* — Ida M Soward
(74) *Attorney, Agent, or Firm* — Winston Hsu

(57) ABSTRACT

A nonvolatile memory cell includes a semiconductor substrate, a first OD region, a second OD region for forming an erase gate region, and a trench isolation region separating the first OD region from the second OD region. A select transistor is disposed on the first OD region. A floating gate transistor is serially connected to the select transistor and is disposed on the first OD region. The floating gate transistor includes a floating gate overlying the first OD region. A floating gate extension continuously extends from the floating gate to the second OD region. A shallow junction diffusion region is situated directly under the floating gate extension within the second OD region.

15 Claims, 17 Drawing Sheets

(51) Int. Cl.
*H01L 29/08* (2006.01)
*H01L 29/10* (2006.01)
*H01L 29/36* (2006.01)
*H01L 29/78* (2006.01)
*H01L 27/11524* (2017.01)
*G11C 16/12* (2006.01)
*H01L 21/326* (2006.01)
*H01L 23/528* (2006.01)
*H01L 27/11526* (2017.01)
*H01L 27/11548* (2017.01)
*H01L 29/788* (2006.01)
*G11C 7/04* (2006.01)
*G11C 7/10* (2006.01)
*H02M 3/07* (2006.01)
*G11C 16/04* (2006.01)
*H02M 1/00* (2006.01)

(56) References Cited

U.S. PATENT DOCUMENTS

| | | | |
|---|---|---|---|
| 8,222,130 B2 * | 7/2012 | Zhang | H01L 27/0922 |
| | | | 438/551 |
| 8,658,495 B2 | 2/2014 | Hsu | |
| 9,041,089 B2 * | 5/2015 | Chen | H01L 27/11524 |
| | | | 257/315 |
| 9,099,392 B2 | 8/2015 | Hsu | |
| 9,373,627 B2 * | 6/2016 | Fu | G11C 16/0408 |
| 9,601,501 B2 * | 3/2017 | Tsao | G11C 5/06 |
| 9,640,262 B2 * | 5/2017 | Hsu | G11C 16/08 |
| 2007/0097743 A1 | 5/2007 | Fang | |
| 2008/0169500 A1 * | 7/2008 | Lojek | H01L 27/115 |
| | | | 257/318 |
| 2010/0213544 A1 * | 8/2010 | Liu | H01L 27/0922 |
| | | | 257/339 |
| 2017/0207230 A1 * | 7/2017 | Sun | G11C 16/12 |
| 2018/0061647 A1 * | 3/2018 | Li | H01L 27/11558 |

* cited by examiner

NONVOLATILE MEMORY HAVING A SHALLOW JUNCTION DIFFUSION REGION

CROSS REFERENCE TO RELATED APPLICATIONS

This application claims the benefit of U.S. provisional application No. 62/362,068 filed Jul. 14, 2016.

BACKGROUND OF THE INVENTION

1. Field of the Invention

The present invention relates to the field of nonvolatile memory devices. More specifically, the present invention relates to a multi-time programmable (MTP) memory and the fabrication methods for making the same.

2. Description of the Prior Art

Semiconductor memory devices have become more popular for use in various electronic devices. For example, non-volatile memory (NVM) is widely used in cellular telephones, digital cameras, personal digital assistants, mobile computing devices, and other applications.

Generally, NVM may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC).

It is known that programming of memory cell can be accomplished by hot electron injection techniques (also known as channel hot electron or CHE programming) and may be erased by FN tunneling via an erase gate. The prior art MTP memory has reduced erase efficiency because of parasitic capacitance.

SUMMARY OF THE INVENTION

It is one object of the invention to provide a single-poly non-volatile memory (NVM) with an erase gate and improved erase efficiency.

According to one embodiment of the invention, a non-volatile memory (NVM) cell includes a semiconductor substrate of a first conductivity type, a first oxide define (OD) region in the semiconductor substrate, a second oxide define (OD) region for forming an erase gate (EG) region, and a trench isolation region separating the first OD region from the second OD region. A select transistor is disposed on the first OD region. A floating gate transistor is serially connected to the select transistor and is disposed on the first OD region. The floating gate transistor comprises a floating gate overlying the first OD region. A floating gate extension continuously extends from the floating gate to the second OD region. A shallow junction diffusion region of a second conductivity type is situated directly under the floating gate extension within the second OD region.

According to one embodiment, the select transistor and the floating gate transistor are PMOS transistors. The select transistor and the floating gate transistor are disposed within an N well.

According to one embodiment, the floating gate extension traverses the trench isolation region between the first OD region and the second OD region. The floating gate extension partially overlaps with the second OD region so as to capacitively couple to the EG region. The EG region is electrically coupled to an erase line.

According to one embodiment, a heavily doped region of the second conductivity type is disposed within the second OD region and adjacent to the floating gate extension.

According to one embodiment, a lightly doped drain (LDD) region of the second conductivity type is disposed within the second OD region between the shallow junction diffusion region and the heavily doped region.

According to one embodiment, the shallow junction diffusion region has a junction depth that is shallower than that of the heavily doped region. The shallow junction diffusion region has a doping concentration that is smaller than that of the heavily doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
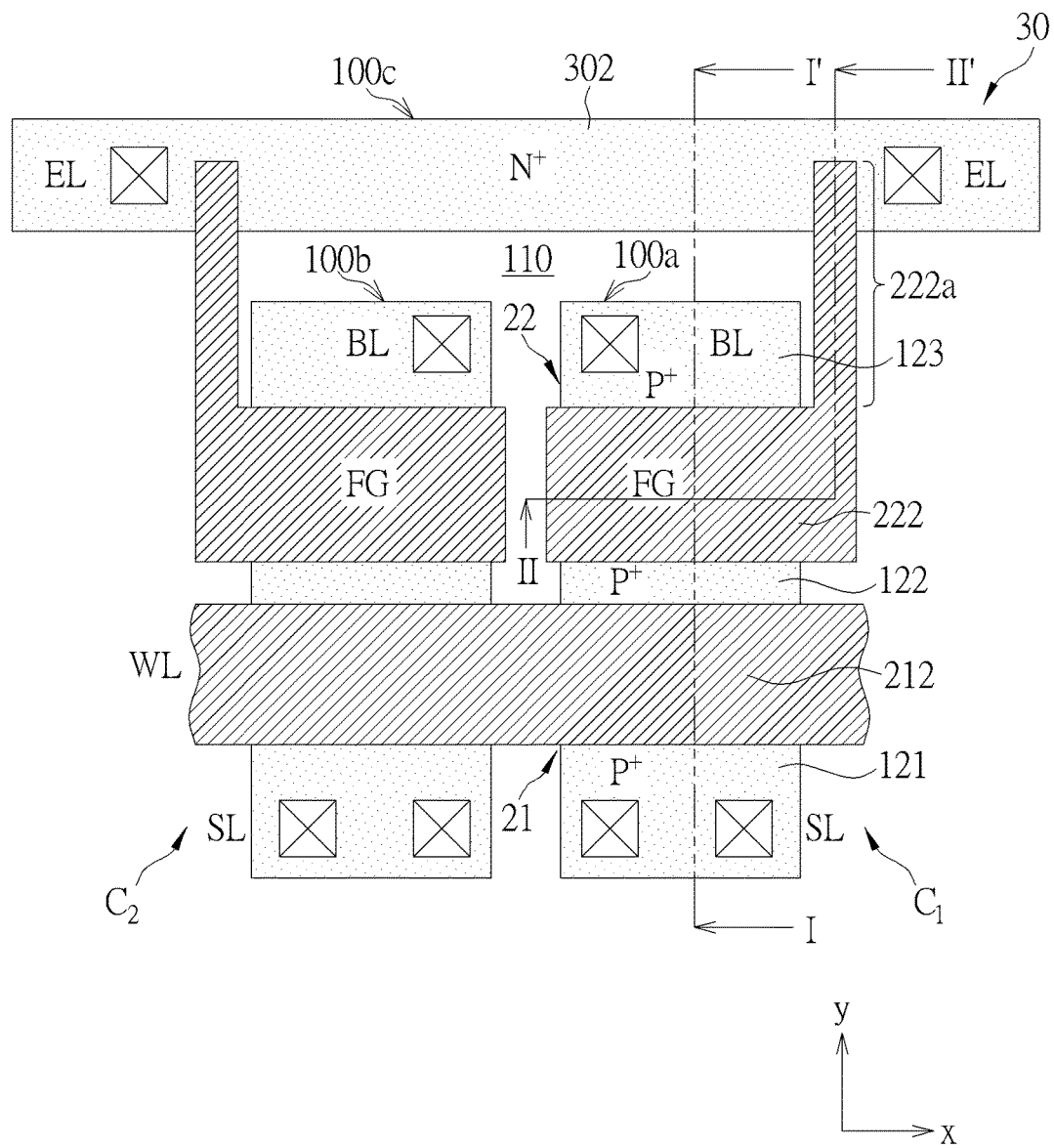
FIG. 1 is a schematic plan view showing an exemplary layout of a single-poly nonvolatile memory cell in accordance with one embodiment of this invention.

In the following description, numerous specific details are given to provide a thorough understanding of the invention. It will, however, be apparent to one skilled in the art that the invention may be practiced without these specific details. Furthermore, some well-known system configurations or process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 2:
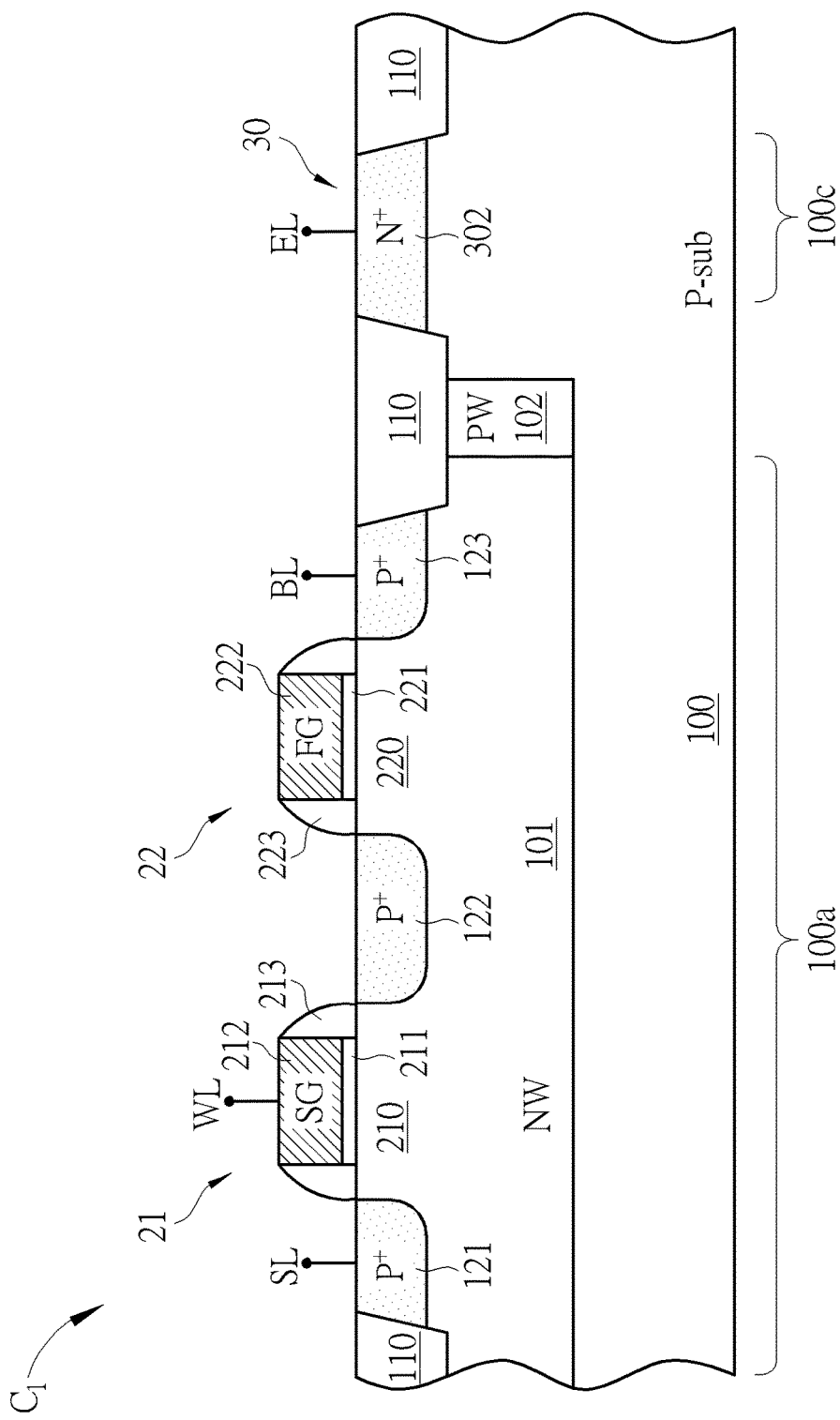
FIG. 2 is a schematic, cross-sectional view taken along line I-I' of FIG. 1.
Figure 3:
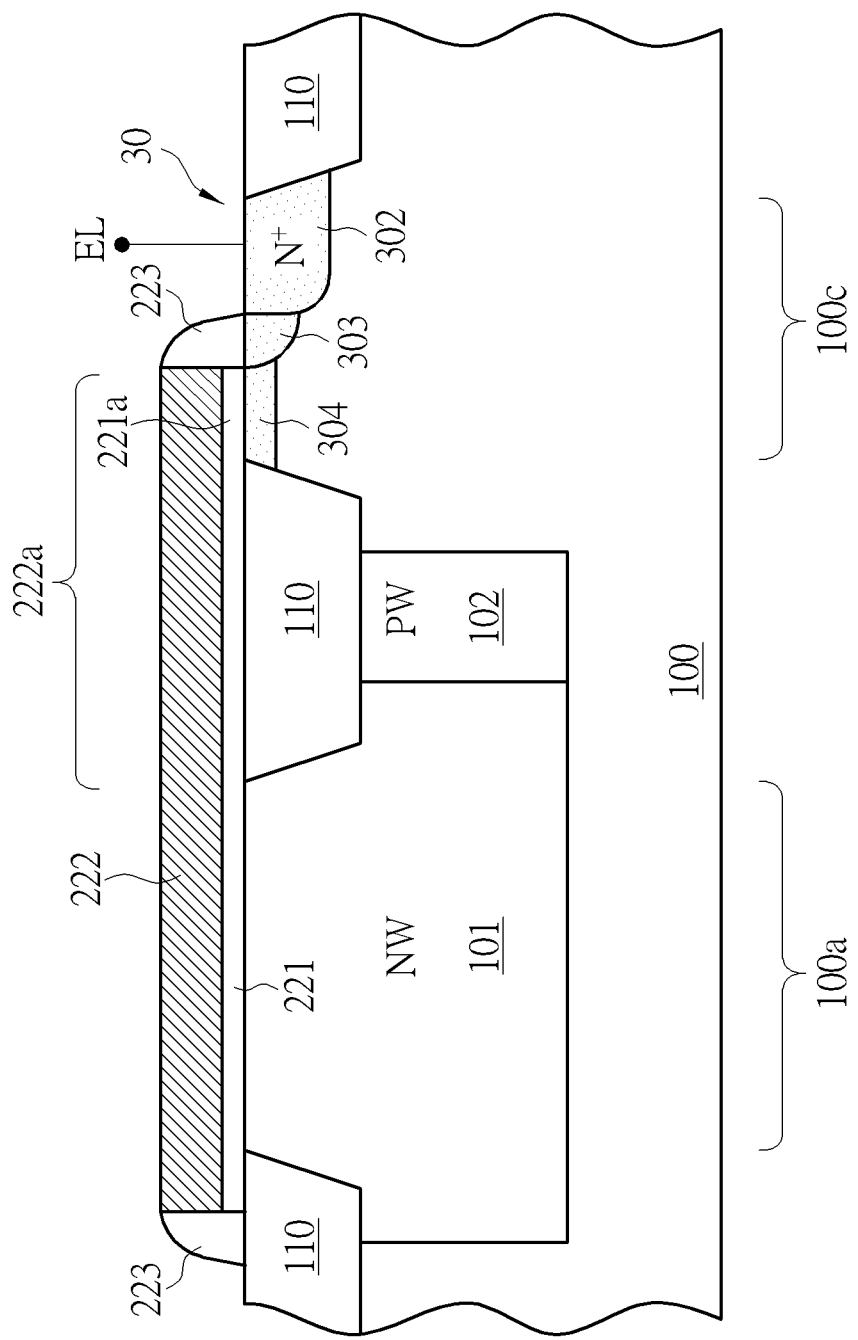
FIG. 3 is a schematic, cross-sectional view taken along line II-II' of FIG. 1.

FIG. 1 is a schematic plan view showing an exemplary layout of a single-poly nonvolatile memory (NVM) cell in accordance with one embodiment of this invention. FIG. 2 is a schematic, cross-sectional view taken along line I-I' of FIG. 1. FIG. 3 is a schematic, cross-sectional view taken along line II-II' of FIG. 1. The demonstrated NVM cell structure may function as a multi-time programmable (MTP) memory unit. It is to be understood that the present invention may be applicable to other memory devices.

As shown in FIG. 1, the two NVM cells $C_1$ and $C_2$ are fabricated on two isolated oxide define (OD) regions 100a and 100b, respectively. The OD region 100a is separated from the OD region 100b by a trench isolation region 110 that is formed in a main surface of a semiconductor substrate 100 of a first conductivity type such as a P type doped silicon substrate (P-Sub). According to the illustrative embodiment, the trench isolation region 110 may be a shallow trench isolation (STI) region, but should not be limited thereto.

According to the illustrative embodiment, the NVM cell $C_1$ is mirror symmetric to the NVM cell $C_2$. For the sake of simplicity, only the NVM cell $C_1$ will be discussed in greater detail. It is to be understood that the layout in FIG. 1 is for illustrative purposes only. The present invention may be applicable to other layout designs.

As shown in FIG. 1 and FIG. 2, according to the illustrative embodiment, the OD region 100a and the OD region 100b are formed within an ion well 101 of a second conductivity type such as an N well (NW). According to another embodiment, a deep N well may be provided in the semiconductor substrate 100 and the ion well 101 may be formed within the deep N well. The NVM cell $C_1$ comprises a select transistor 21 and a floating gate transistor 22 serially connected to the select transistor 21. The serially connected select transistor 21 and the floating gate transistor 22 may be formed directly on the OD region 100a.

According to the illustrative embodiment, the select transistor 21 may be a PMOS transistor and comprises a source doping region 121 in the N well 101, a common doping region 122 spaced apart from the source doping region 121, a select gate channel region 210 near the main surface of the semiconductor substrate 100 between the source doping region 121 and the common doping region 122, a select gate (SG) 212 coupled to a word line (WL) overlying the select gate channel region 210, and a gate dielectric layer 211 between the select gate 212 and the select gate channel region 210. Sidewall spacers 213 may be formed on opposite sidewalls of the select gate 212.

According to the illustrative embodiment, the source doping region 121 and the common doping region 122 may have the first conductivity type. For example, the source doping region 121 and the common doping region 122 may be $P^+$ doping regions. According to the illustrative embodiment, the source doping region 121 may be electrically coupled to a source line SL.

The floating gate transistor 22 is formed directly on the OD region 100a. The floating gate transistor 22 is serially coupled to the select transistor 21 through the common doping region 122. The common doping region 122 is shared by the floating gate transistor 22 and the select transistor 21, thereby forming two serially connected transistors 21 and 22, and in this illustrative case, two serially connected PMOS transistors.

The floating gate transistor 22 comprises a floating gate (FG) 222 overlying the OD region 100a. According to the illustrative embodiment, the floating gate 222 consists of a single layer of polysilicon, for example, $N^+$ doped polysilicon or $P^+$ doped polysilicon. According to the illustrative embodiment, the floating gate 222 is a single poly gate. That is, no additional poly gate is stacked on the floating gate 222. According to the illustrative embodiment, the floating gate transistor 22 serves as the charge storage element of the NVM cell $C_1$. According to the illustrative embodiment, the word line (WL) may have a straight line-shaped conductive pattern and extend along a first direction or a reference x-axis. According to the illustrative embodiment, the portions of the word line WL that directly overlaps with the OD regions are deemed as the select gates.

The floating gate transistor 22 further comprises the common doping region 122 on one side of the floating gate (FG) 222, a drain doping region 123 on the other side of the floating gate 222 that is opposite to the common doping region 122, a floating gate channel region 220 between the common doping region 122 and the drain doping region 123, and a gate dielectric layer 221 between the floating gate 222 and the floating gate channel region 220. Sidewall spacers 223 may be formed on opposite sidewalls of the floating gate 222.

According to the illustrative embodiment, the drain doping region 123 may have the first conductivity type. For example, the drain doping region 123 may be a $P^+$ doping region and may be electrically coupled to a bit line BL.

According to the illustrative embodiment, as can be seen in FIG. 2, the gate dielectric layer 221 may have a thickness that is equal to that of the gate dielectric layer 211. According to the illustrative embodiment, the select transistor 21 and the floating gate transistor 22 share the same N well 101.

As can be seen in FIG. 1 and FIG. 3, according to the illustrative embodiment, the NVM cell $C_1$ further comprises a floating gate extension 222a continuously extending from the floating gate 222 to an OD region 100c and is adjacent to an erase gate (EG) region 30, which is coupled to an erase line EL. The floating gate extension 222a traverses the trench isolation region 110 between the OD region 100a and the OD region 100c and partially overlaps with the OD region 100c to capacitively couple to the EG region 30. The floating gate extension 222a may have a slender shape when viewed from the above and extends along a second direction or a reference y-axis.

According to the illustrative embodiment, an isolation ion well 102 of the first conductivity type such as a P well may be disposed under the trench isolation region 110 between the OD region 100a and the OD region 100c. The EG region 30 comprises a heavily doped region 302 of the second conductivity type such as an $N^+$ doping region adjacent to the floating gate extension 222a. A lightly doped drain (LDD) region 303 such as an NLDD may be disposed in the semiconductor substrate 100 and may be situated directly under the spacer 223. The LDD region 303 is contiguous with the heavily doped region 302.

According to the illustrative embodiment, a shallow junction diffusion region 304 is formed in the semiconductor substrate 100. The shallow junction diffusion region 304 is situated directly under the floating gate extension 222a and is contiguous with the LDD region 303. According to the illustrative embodiment, a gate dielectric layer 221a may be formed between the floating gate extension 222a and the shallow junction diffusion region 304. According to the illustrative embodiment, the heavily doped region 302 is formed in an area that is not covered by the floating gate extension 222a.

In operation, such as an erase operation, the heavily doped region 302 is electrically coupled to an erase line voltage ($V_{EL}$). According to the illustrative embodiment, the shallow junction diffusion region 304 is situated directly under the floating gate extension 222a in the EG region 30. By incorporating the shallow junction diffusion region 304 in the EG region 30, the erase efficiency is improved.

According to the illustrative embodiment, the shallow junction diffusion region 304 has the second conductivity type such as N type and has a junction depth that is shallower than that of the heavily doped region 302. According to the illustrative embodiment, the shallow junction diffusion region 304 has a doping concentration that is smaller than that of the heavily doped region 302.

For example, the heavily doped region 302 may have a doping concentration ranging between 5E14~2E15 atoms/$cm^3$, the LDD region 303 may have a doping concentration ranging between 5E13~2E14 atoms/$cm^3$, and the shallow junction diffusion region 304 may have a doping concentration ranging between 1E13~1E14 atoms/$cm^3$.

FIGS. 4-9 are schematic, cross-sectional diagrams showing the exemplary steps of forming the shallow junction diffusion region 304 in the EG region 30 according to one embodiment of the invention, wherein like numeral numbers designate like layers, regions, and elements. FIGS. 4-9 illustrate a common-well method.

Figure 4:
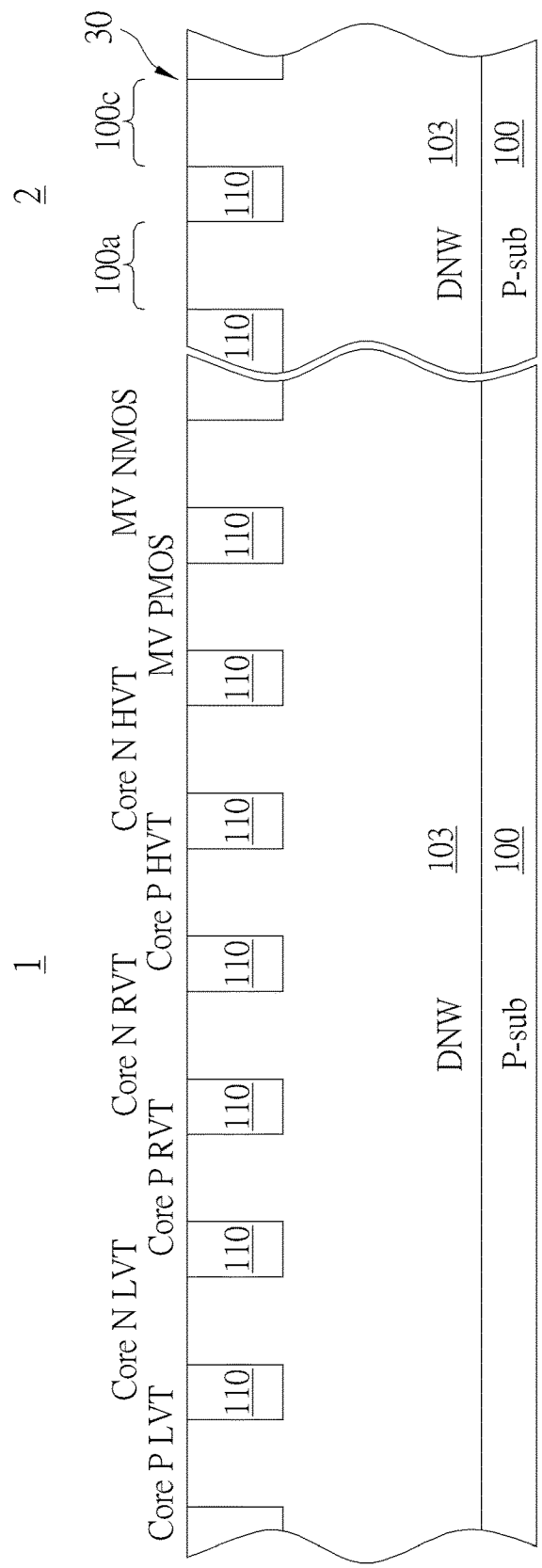
FIGS. 4-9 are schematic, cross-sectional diagrams showing the exemplary steps of forming the shallow junction diffusion region in the EG region according to one embodiment of the invention.

As shown in FIG. 4, a semiconductor substrate 100 such as a P-type silicon substrate is provided. The semiconductor substrate 100 comprises a logic circuit region 1 and a memory cell region 2. A deep ion well 103 such as a deep N well (NDW) is formed in the logic circuit region 1 and the memory cell region 2. Trench isolation regions 110 are formed in the semiconductor substrate 100 to define a plurality of oxide define (OD) regions including, but not limited to, Core P LVT, Core N LVT, Core P RVT, Core N RVT, Core P HVT, Core N HVT, MV PMOS, and MV NMOS, in the logic circuit region 1, and the OD regions 100a and 100c in the memory cell region 2.

The term "Core P LVT" means the OD region for P type core device with low threshold voltages. The term "Core N LVT" means the OD region for N type core device with low threshold voltages. The term "Core P RVT" means the OD region for P type core device with regular threshold voltages. The term "Core N RVT" means the OD region for N type core device with regular threshold voltages. The term "Core P HVT" means the OD region for P type core device with high threshold voltages. The term "Core N HVT" means the OD region for N type core device with high threshold voltages. The terms "MV PMOS" and "MV NMOS" are OD regions for medium-voltage PMOS and NMOS input/output (I/O) devices.

It is understood that the terms "low threshold voltage", "regular threshold voltage", and "high threshold voltage" are relative terms and may vary depending upon the generation of semiconductor technology. For clarity, however, it is defined that the term "regular threshold voltage" means the threshold voltage between the low threshold voltage and the high threshold voltage at a particular generation or technology node.

Figure 5:
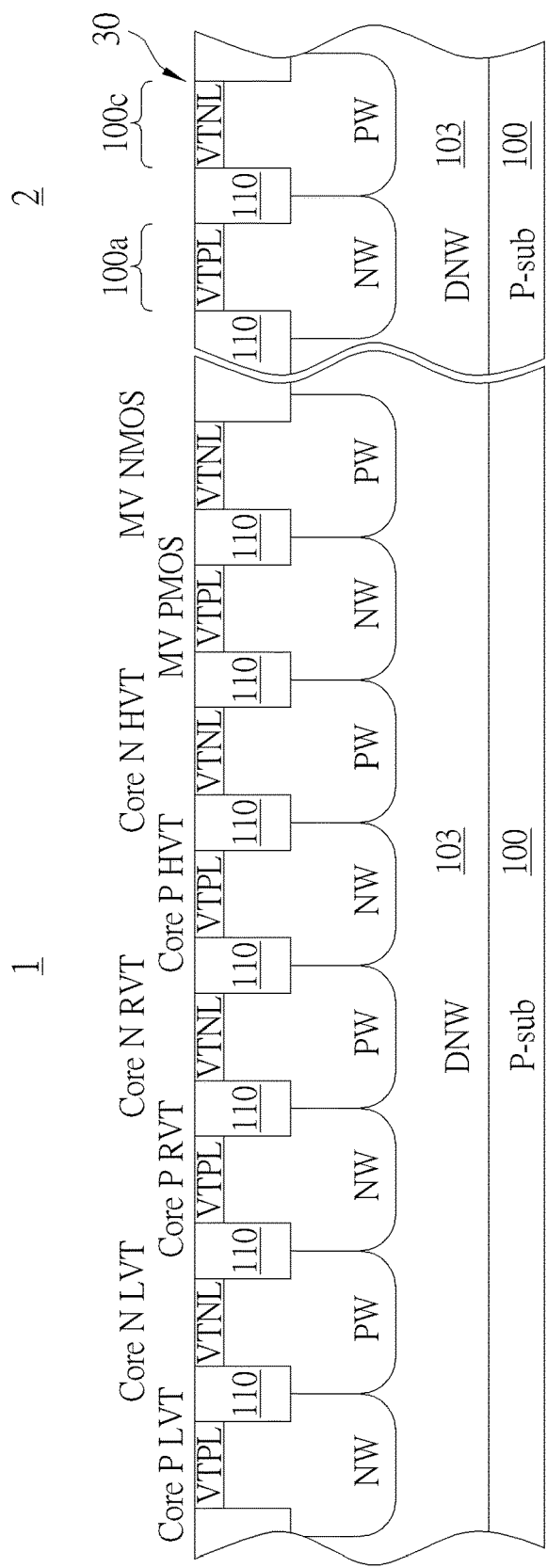

As shown in FIG. 5, after the formation of the deep ion well, an N well (NW) is formed in each of the OD regions: Core P LVT, Core P RVT, Core P HVT, MV PMOS, and the OD region 100a, and a P well is formed in each of the OD regions: Core N LVT, Core N RVT, Core N HVT, MV NMOS, and the OD region 100c. After the formation of the N wells in the logic circuit region 1 and the memory cell region 2, Vt adjustment implant is carried out to form a doping region denoted as VTPL in each N well. After the formation of the P wells in the logic circuit region 1 and the memory cell region 2, Vt adjustment implant is carried out to form a doping region denoted as VTNL in each P well.

Figure 6:
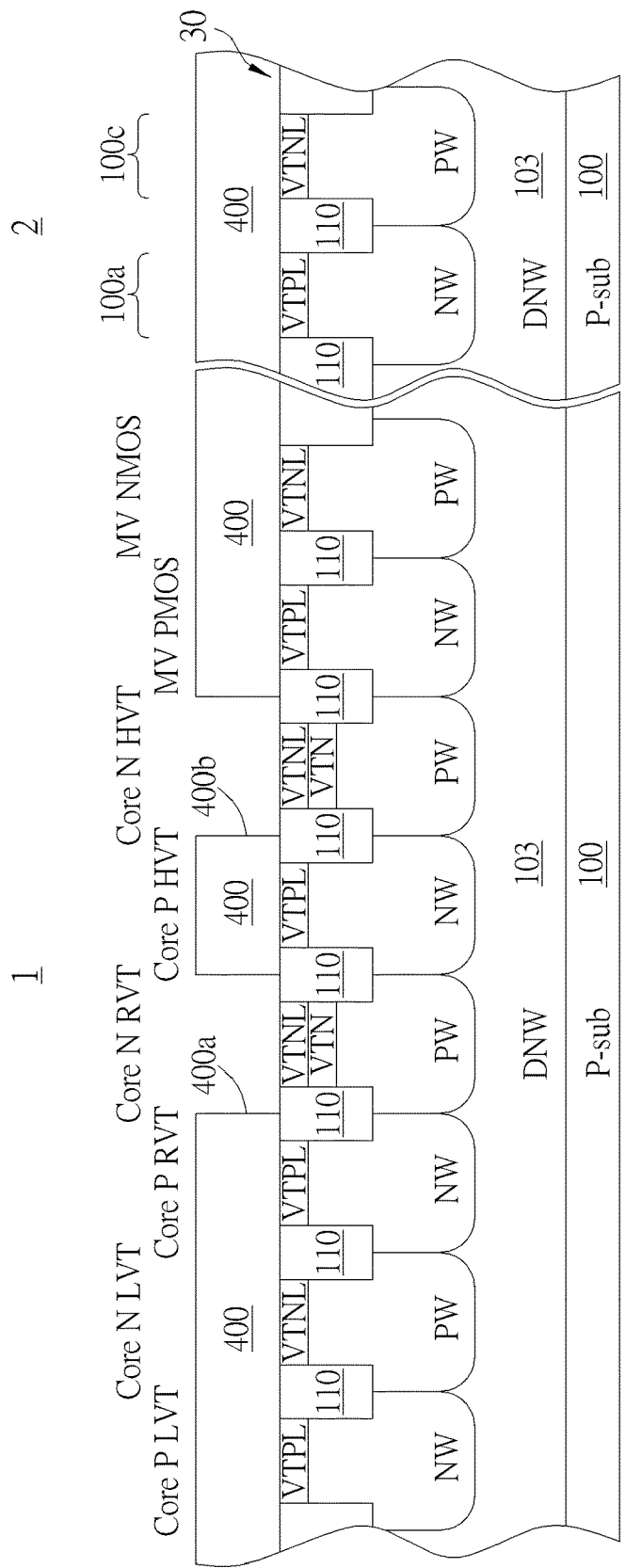

As shown in FIG. 6, after the formation of the VTPL in each N well and VTNL in each P well, a photoresist pattern 400 is formed on the semiconductor substrate 100. The photoresist pattern 400 has an opening 400a that exposes the OD region: Core N RVT, and an opening 400b that exposes the OD region: Core N HVT. The memory cell region 2 is covered by the photoresist pattern 400. The exposed OD regions: Core N RVT and Core N HVT are subjected to another Vt adjustment implant, thereby forming a P type doping region denoted as VTN in each of the OD regions: Core N RVT and Core N HVT. The photoresist pattern 400 is then removed.

Figure 7:
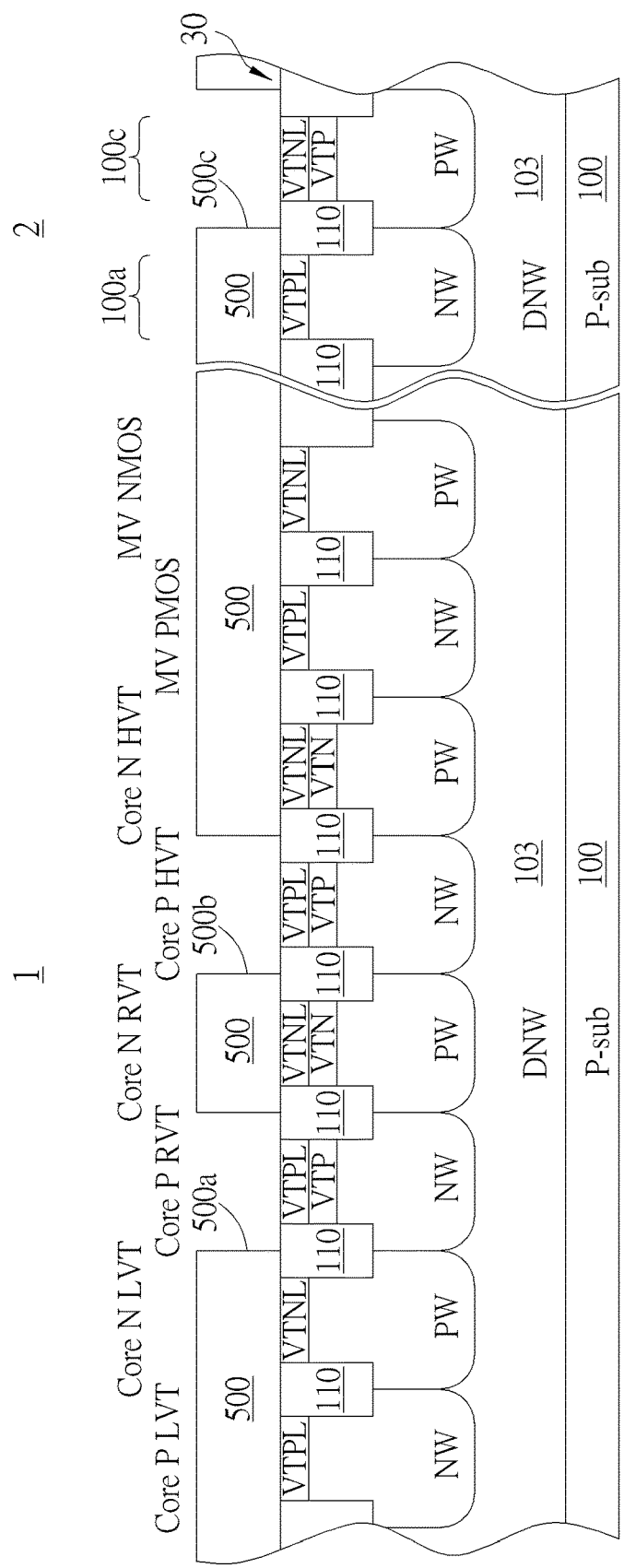

As shown in FIG. 7, a photoresist pattern 500 is formed on the semiconductor substrate 100. The photoresist pattern 500 has an opening 500a that exposes the OD region: Core P RVT, an opening 500b that exposes the OD region: Core P HVT, and an opening 500c that exposes the OD region 100c for forming the EG region 30. The exposed OD regions: Core P RVT, Core P HVT, and the OD region 100c are subjected to another Vt (threshold voltage) adjustment implant, thereby forming an N type doping region denoted as VTP in each of the OD regions: Core N RVT, Core N HVT, and the OD region 100c. The photoresist pattern 500 is then removed.

It is understood that the doping regions such as VTN and VTP are shown for clarity and for illustration purposes only. The figures are not drawn to scale and the actual junction depth of each of the doping regions is not explicitly shown in the figures.

Figure 8:
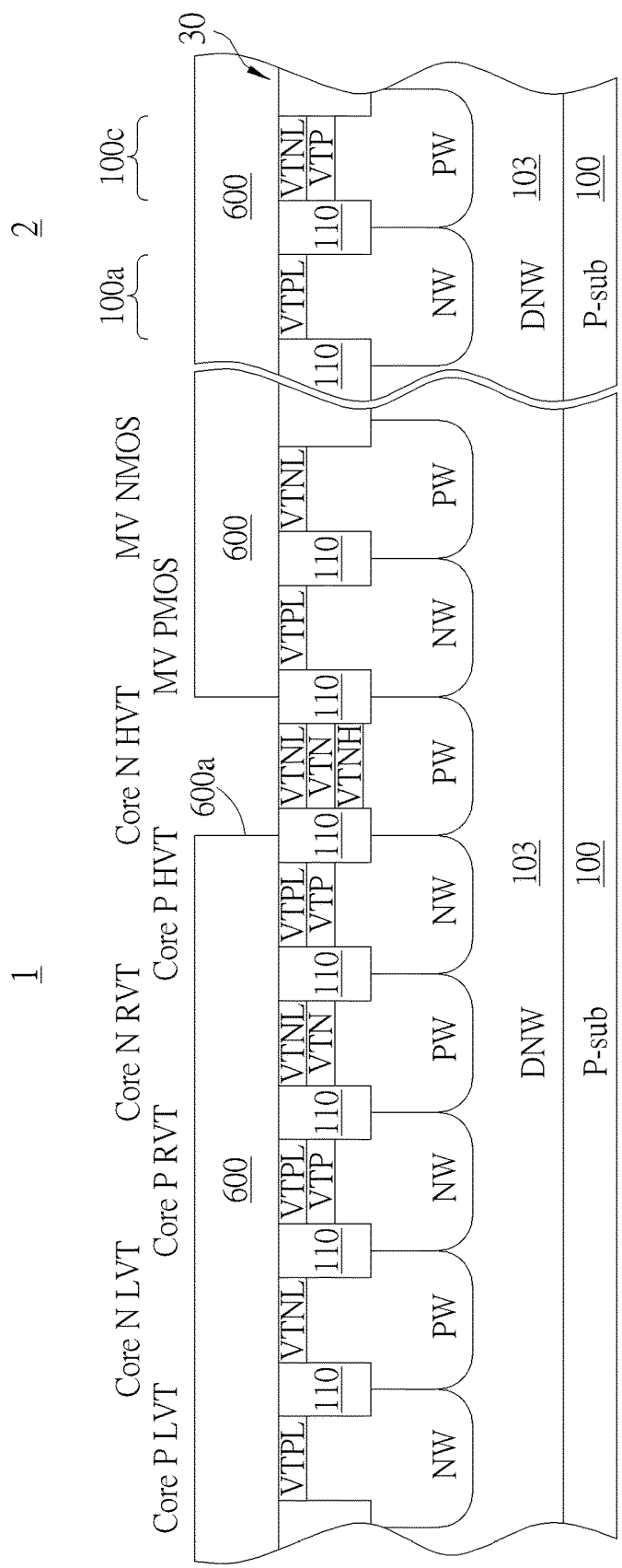

As shown in FIG. 8, subsequently, a photoresist pattern 600 is formed on the semiconductor substrate 100. The photoresist pattern 600 has an opening 600a that exposes only the OD region: Core N HVT. The exposed OD region: Core N HVT is subjected to another Vt adjustment implant, thereby forming a P type doping region denoted as VTNH in the OD region: Core N HVT. The photoresist pattern 600 is then removed.

Figure 9:
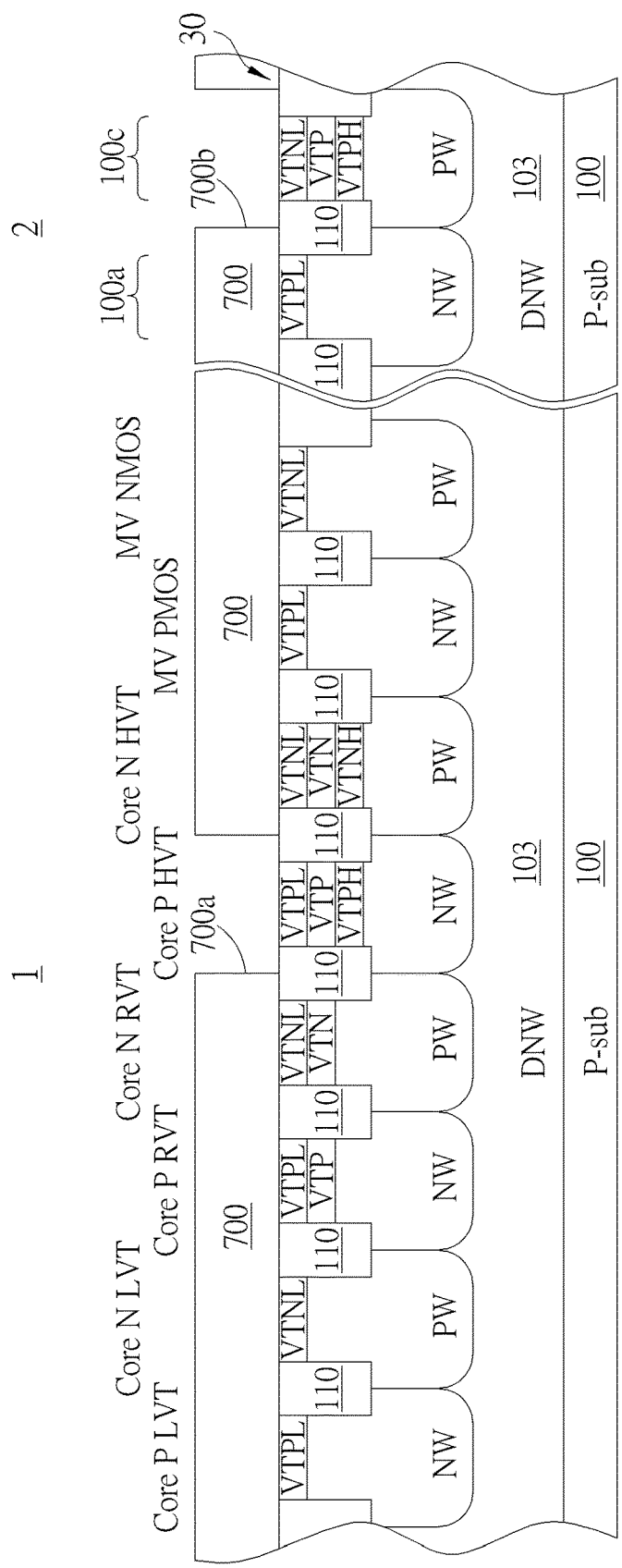

As shown in FIG. 9, subsequently, a photoresist pattern 700 is formed on the semiconductor substrate 100. The photoresist pattern 700 has an opening 700a that exposes the OD region: Core P HVT and an opening 700b that exposes the OD region 100c. The exposed OD region: Core P HVT and the OD region 100c are subjected to another Vt adjustment implant, thereby forming an N type doping region denoted as VTPH in each of the OD region: Core P HVT and the OD region 100c. The photoresist pattern 700 is then removed.

According to the common well method described through FIG. 4 to FIG. 9, shallow junction diffusion region 304 in the EG region 30 of the OD region 100c may be composed of the three doping regions: VTNL, VTP, and VTPH. Moreover, one of the doping regions (VTP and VTPH) may be omitted if needed.

FIGS. 10-17 are schematic, cross-sectional diagrams showing the exemplary steps of forming the shallow junction diffusion region 304 in the EG region 30 according to another embodiment of the invention, wherein like numeral numbers designate like layers, regions, and elements. FIGS. 10-17 illustrate a split-well method. The term "IO PMOS" means the OD region for PMOS input/out (I/O) devices. The term "IO NMOS" means the OD region for NMOS input/out (I/O) devices.

Figure 10:
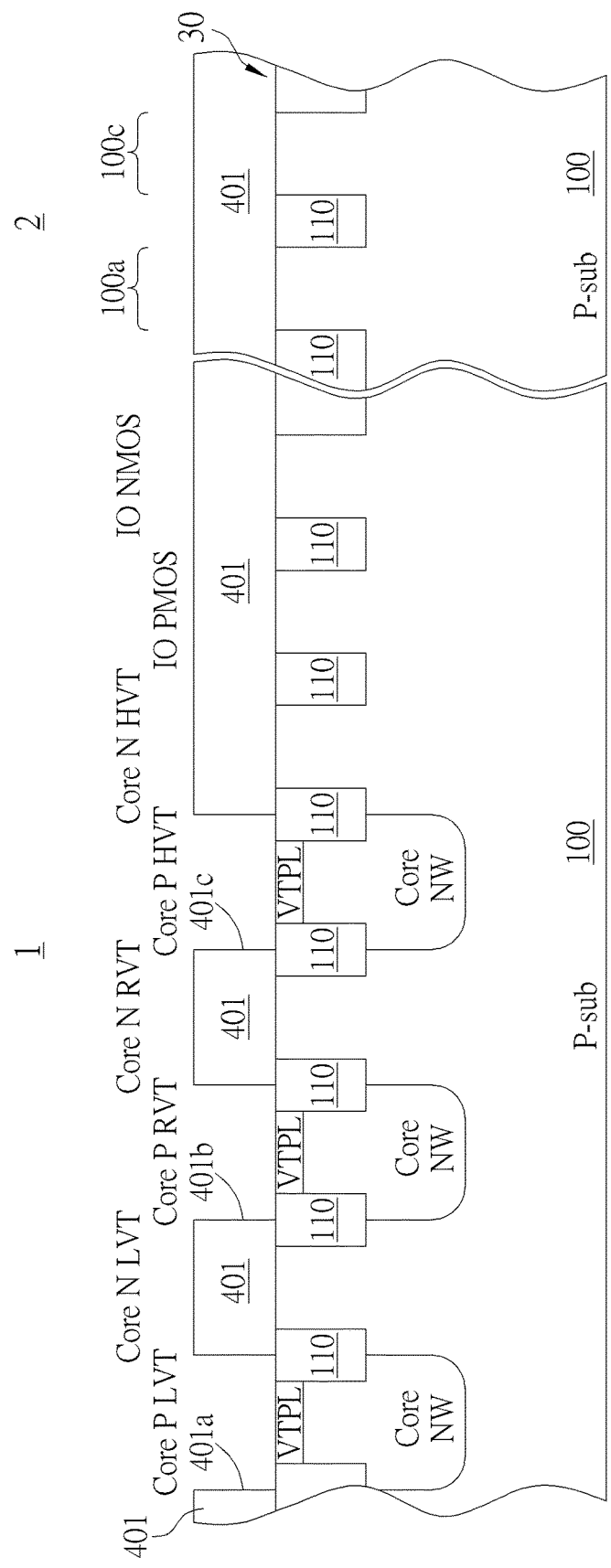
FIGS. 10-17 are schematic, cross-sectional diagrams showing the exemplary steps of forming the shallow junction diffusion region in the EG region according to another embodiment of the invention.

As shown in FIG. 10, a photoresist pattern 401 is formed on the semiconductor substrate 100. The photoresist pattern 401 has an opening 401a that exposes the OD region: Core P LVT, an opening 401b that exposes the OD region: Core P RVT, and an opening 401c that exposes the OD region: Core P HVT. The exposed OD regions: Core P LVT, Core P RVT, Core P HVT are subjected to an ion well implant and a subsequent Vt adjustment implant, thereby forming an N well and an N type doping region denoted as VTPL in each of the OD regions: Core P LVT, Core P RVT, Core P HVT. The photoresist pattern 401 is then removed.

Figure 11:
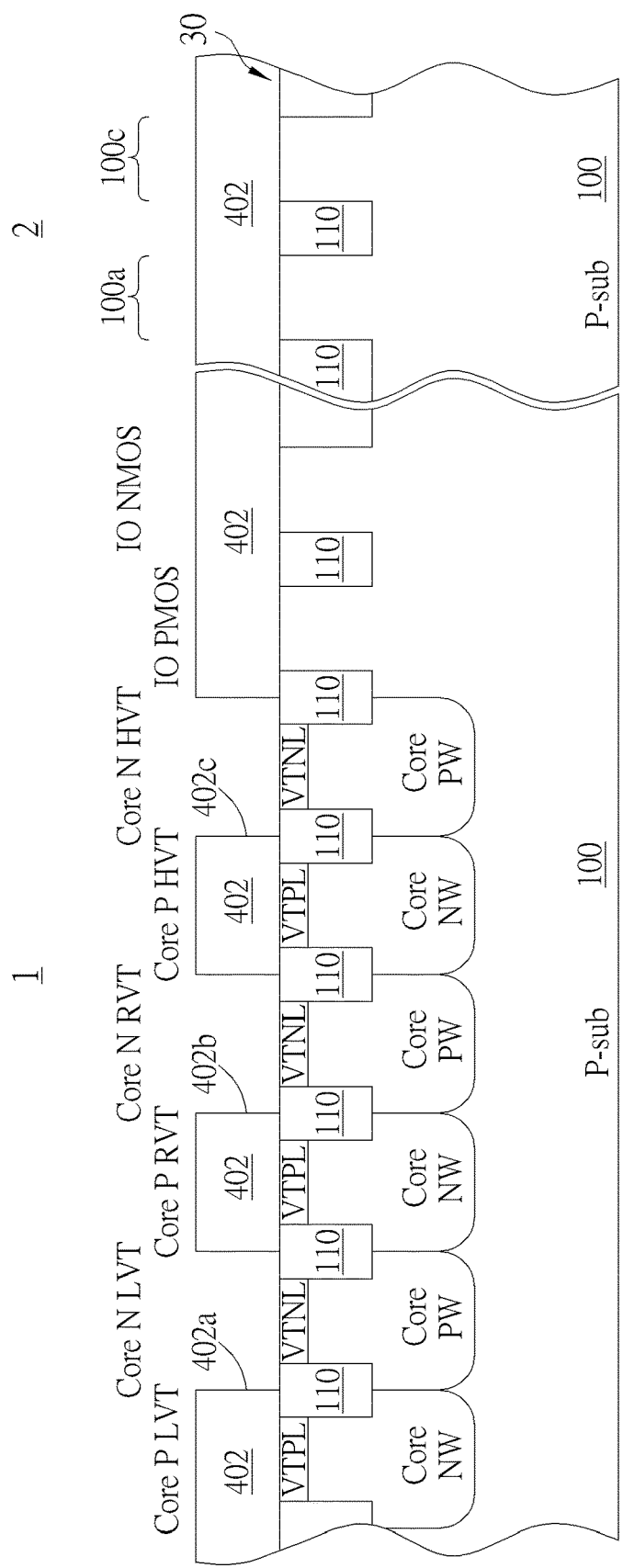

As shown in FIG. 11, a photoresist pattern 402 is formed on the semiconductor substrate 100. The photoresist pattern 402 has an opening 402a that exposes the OD region: Core N LVT, an opening 402b that exposes the OD region: Core N RVT, and an opening 402c that exposes the OD region: Core N HVT. The exposed OD regions: Core N LVT, Core N RVT, Core N HVT are subjected to an ion well implant and a subsequent Vt adjustment implant, thereby forming a P well and a P type doping region denoted as VTNL in each of the OD regions: Core N LVT, Core N RVT, Core N HVT. The photoresist pattern 402 is then removed.

Figure 12:
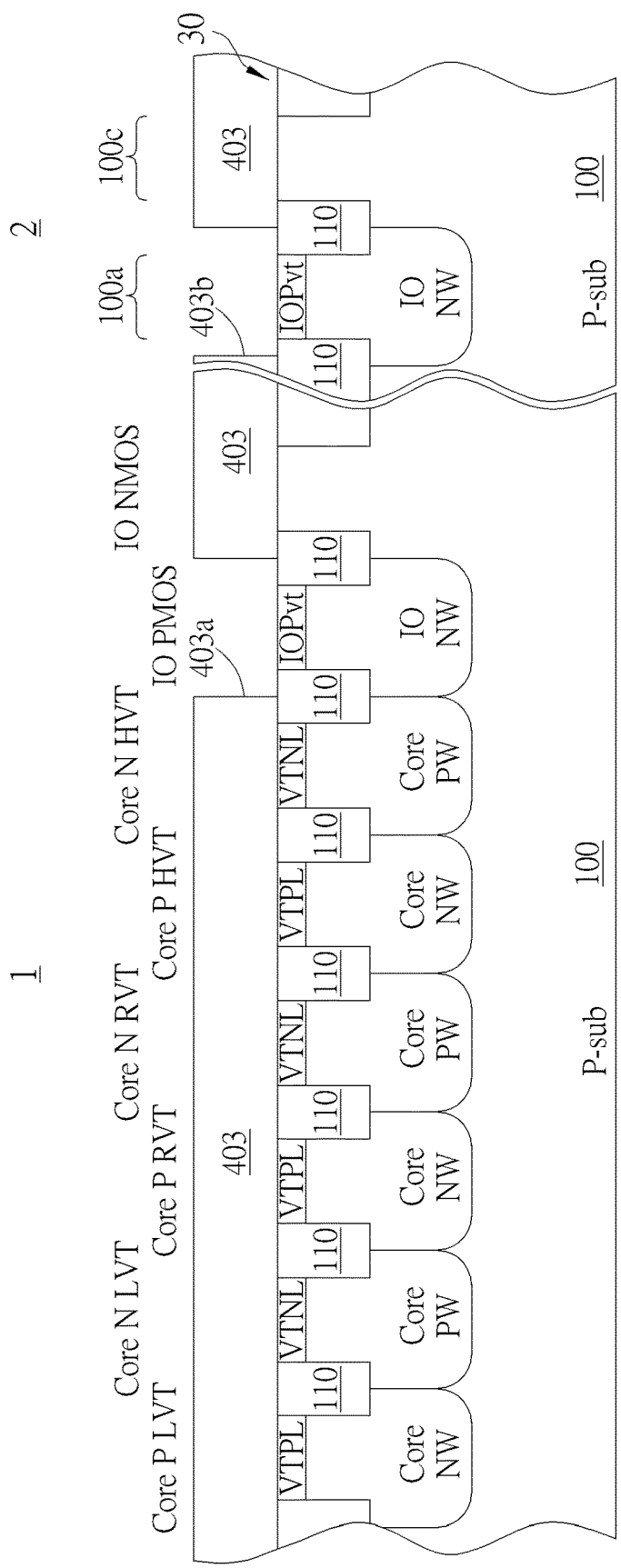

As shown in FIG. 12, after the formation of the core N wells and core P wells, a photoresist pattern 403 is formed on the semiconductor substrate 100. The photoresist pattern 403 has an opening 403a that exposes the OD region: IO PMOS, an opening 403b that exposes the OD regions 100a in the memory cell region 2. The exposed OD regions: IO PMOS and the OD region 100a are subjected to an ion well implant and a subsequent Vt adjustment implant, thereby forming an N well (IONW) and a N type doping region denoted as IOPvt in each of the OD region: IO PMOS and the OD region 100a. The photoresist pattern 403 is then removed.

Figure 13:
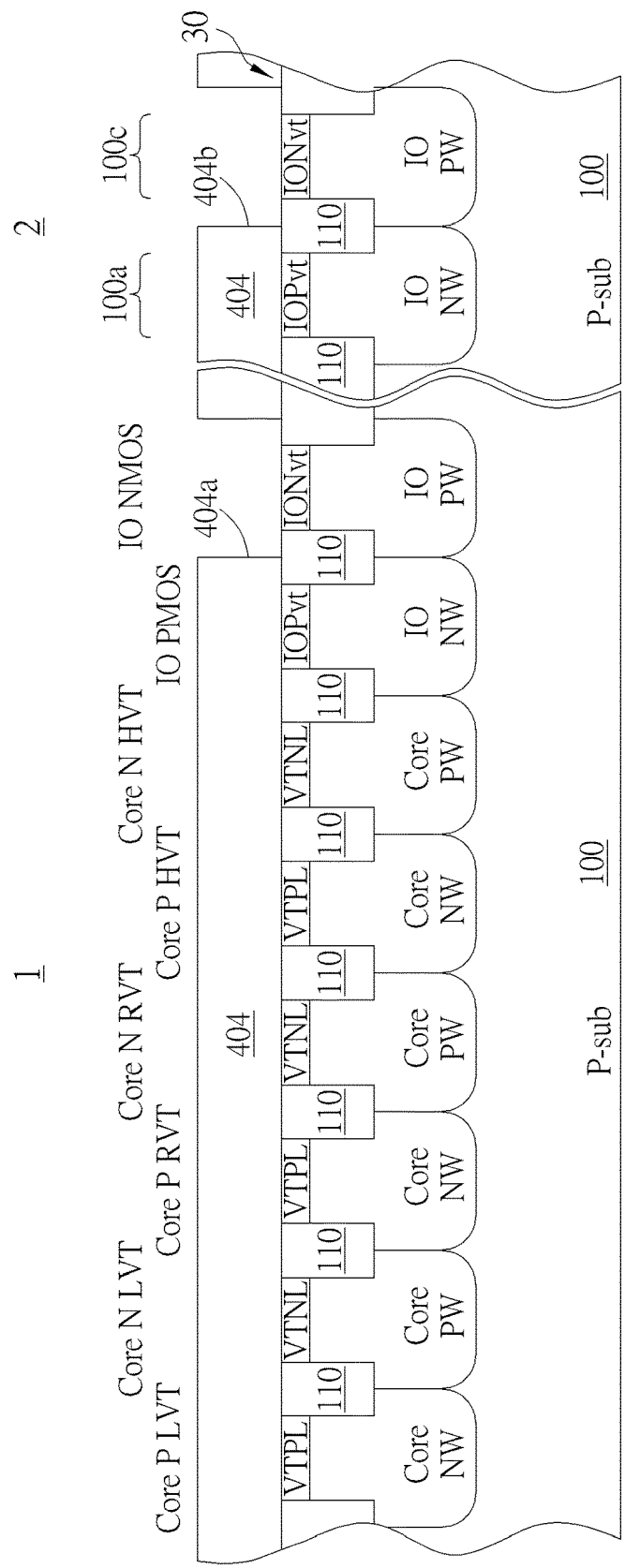

As shown in FIG. 13, after the formation of IONW, a photoresist pattern 404 is formed on the semiconductor substrate 100. The photoresist pattern 404 has an opening 404a that exposes the OD region: IO NMOS, an opening 404b that exposes the OD regions 100c in the memory cell region 2. The exposed OD regions: IO NMOS and the OD region 100c are subjected to an ion well implant and a subsequent Vt adjustment implant, thereby forming an P well (IOPW) and an P type doping region denoted as IONvt in each of the OD region: IO NMOS and the OD region 100c. The photoresist pattern 404 is then removed.

Figure 14:
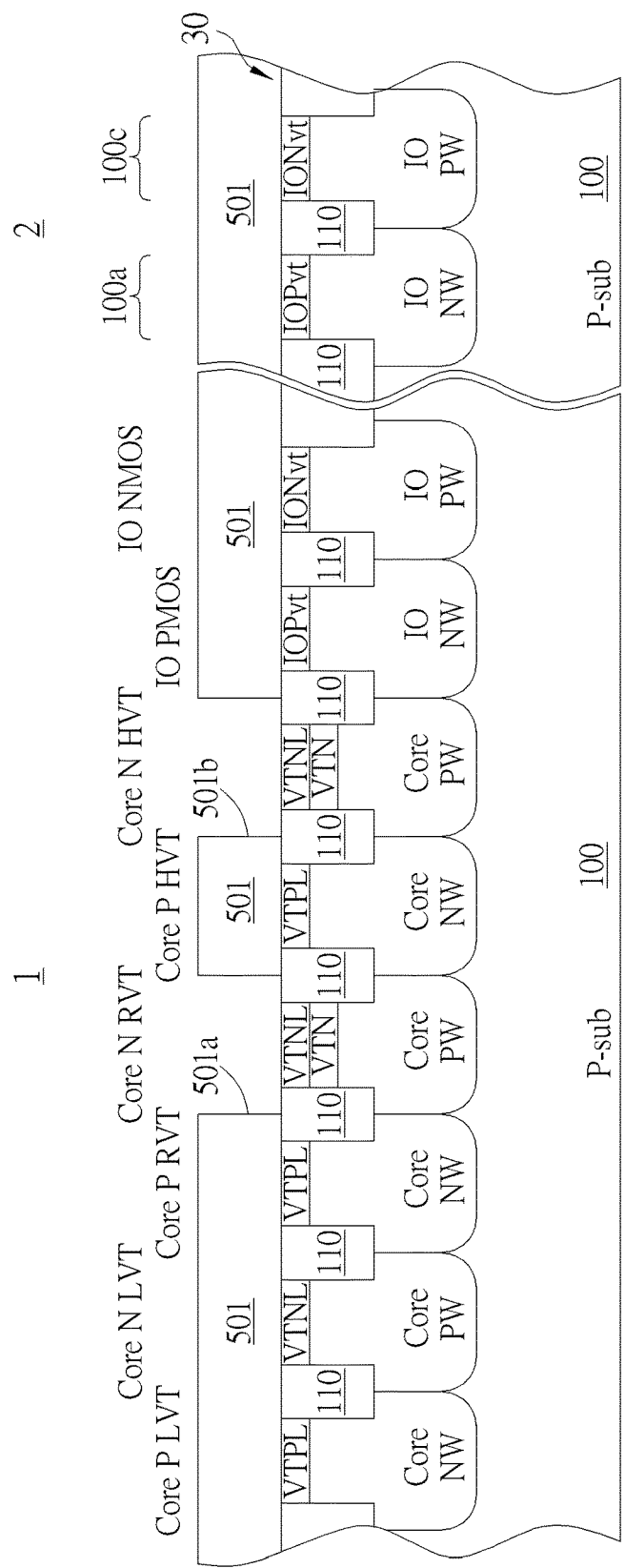

As shown in FIG. 14, after the formation of IONW and IOPW, a photoresist pattern 501 is formed on the semiconductor substrate 100. The photoresist pattern 501 has an opening 501a that exposes the OD region: Core N RVT, and an opening 501b that exposes the OD region: Core N HVT. The exposed OD regions: Core N RVT and Core N HVT are subjected to a Vt adjustment implant, thereby forming a P type doping region denoted as VTN in each of the OD regions: Core N RVT and Core N HVT. The photoresist pattern 501 is then removed.

Figure 15:
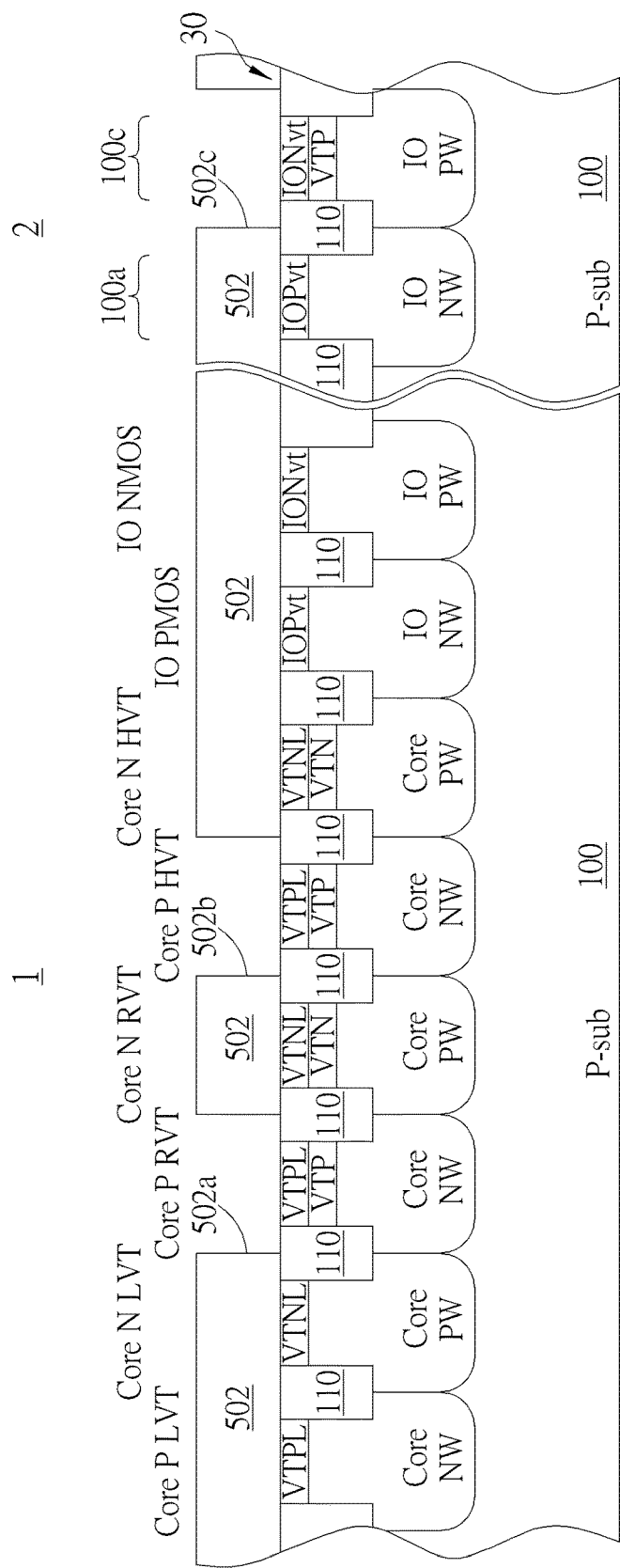

As shown in FIG. 15, a photoresist pattern 502 is formed on the semiconductor substrate 100. The photoresist pattern 502 has an opening 502a that exposes the OD region: Core P RVT, an opening 502b that exposes the OD region: Core P HVT, and an opening 502c that exposes the OD region 100c for forming the EG region 30. The exposed OD regions: Core P RVT, Core P HVT, and the OD region 100c are subjected to another Vt adjustment implant, thereby forming an N type doping region denoted as VTP in each of the OD regions: Core P RVT, Core P HVT, and the OD region 100c. The photoresist pattern 502 is then removed.

Figure 16:
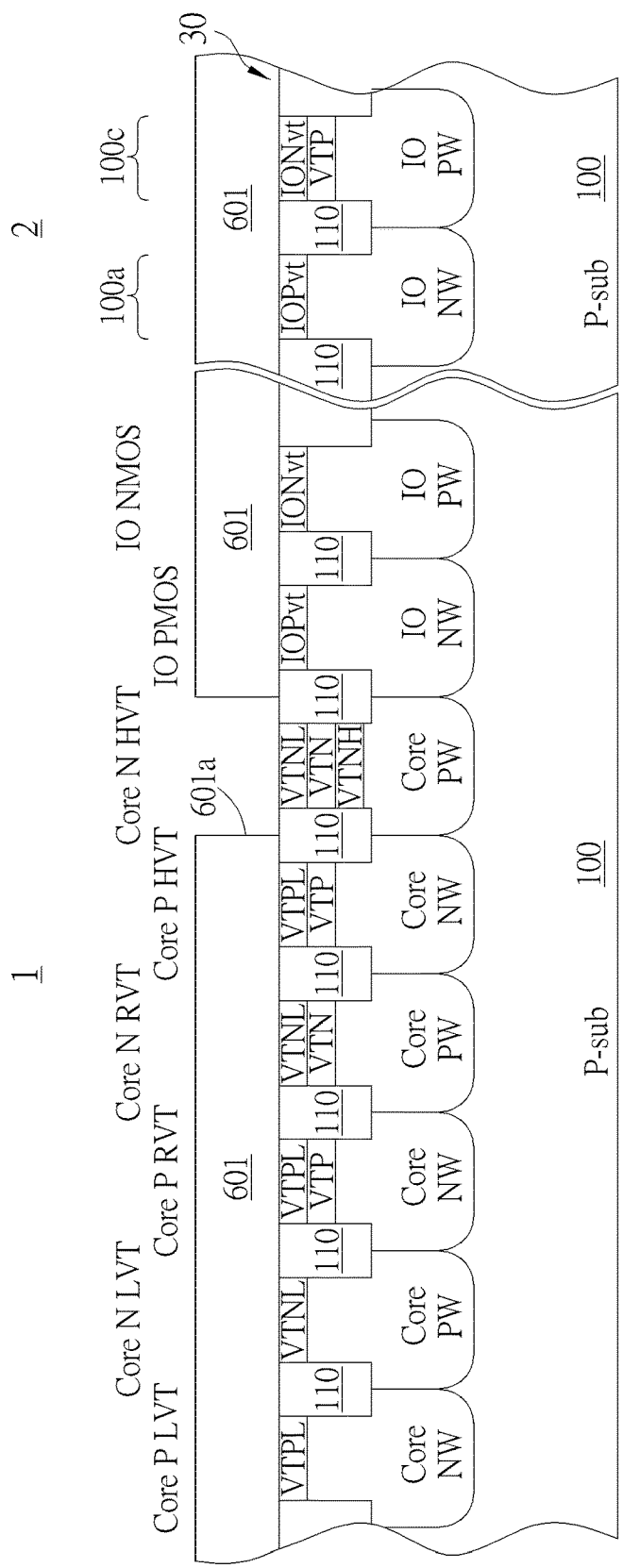

As shown in FIG. 16, subsequently, a photoresist pattern 601 is formed on the semiconductor substrate 100. The photoresist pattern 601 has an opening 601a that exposes only the OD region: Core N HVT. The exposed OD region: Core N HVT is subjected to another Vt adjustment implant, thereby forming a P type doping region denoted as VTNH in the OD region: Core N HVT. The photoresist pattern 601 is then removed.

Figure 17:
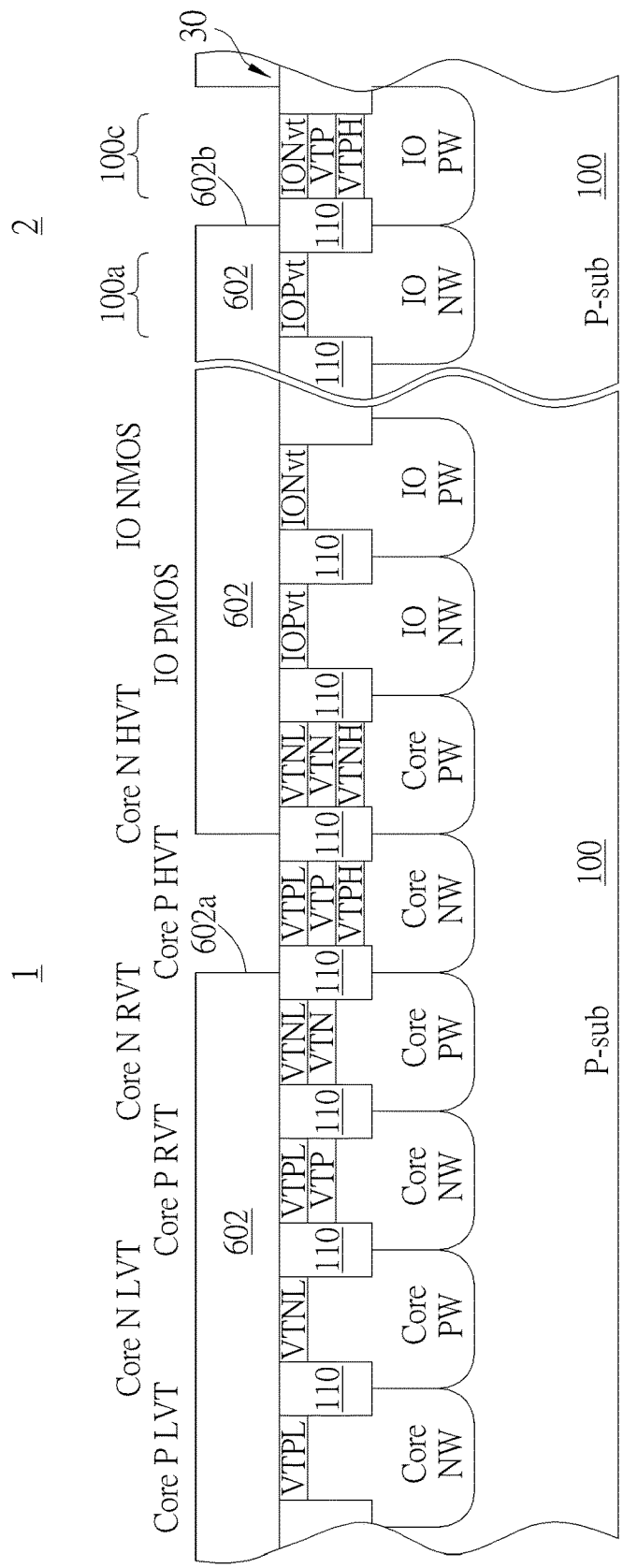

As shown in FIG. 17, subsequently, a photoresist pattern 602 is formed on the semiconductor substrate 100. The photoresist pattern 602 has an opening 602a that exposes the OD region: Core P HVT and the OD region 100c. The exposed OD region: Core P HVT and the OD region 100c are subjected to another Vt adjustment implant, thereby forming an N type doping region denoted as VTPH in each of the OD region: Core P HVT and the OD region 100c. The photoresist pattern 602 is then removed.

According to the split-well method described through FIG. 10 to FIG. 17, shallow junction diffusion region 304 in the EG region 30 of the OD region 100c may be composed of the three doping regions: IONvt, VTP, and VTPH. Moreover, one of the doping regions (VTP and VTPH) may be omitted if needed.

After the formation of the VTPH, polysilicon gate structures are formed in each of the OD regions. LDD regions are then formed in the OD regions. After the formation of the LDD regions, spacers are formed on sidewalls of the gate structures, and $N^+$ or $P^+$ source/drain doping regions are formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A nonvolatile memory (NVM) cell, comprising:
a semiconductor substrate of a first conductivity type;
a first oxide define (OD) region in the semiconductor substrate;
a second oxide define (OD) region for forming an erase gate (EG) region being spaced apart from the first OD region;
a trench isolation region separating the first OD region from the second OD region;
a select transistor disposed on the first OD region;
a floating gate transistor serially connected to the select transistor and being disposed on the first OD region, wherein the floating gate transistor comprises a floating gate overlying the first OD region;
a floating gate extension continuously extending from the floating gate to the second OD region; and
a shallow junction diffusion region of a second conductivity type situated directly under the floating gate extension within the second OD region.

2. The NVM cell according to claim 1, wherein the select transistor and the floating gate transistor are PMOS transistors and the select transistor and the floating gate transistor are disposed within an N well.

3. The NVM cell according to claim 2, wherein the first conductivity type is P type and the second conductivity type is N type.

4. The NVM cell according to claim 1 further comprising an isolation ion well of the first conductivity type disposed under the trench isolation region.

5. The NVM cell according to claim 1, wherein the floating gate extension traverses the trench isolation region between the first OD region and the second OD region, and wherein the floating gate extension partially overlaps with the second OD region so as to capacitively couple to the EG region.

6. The NVM cell according to claim 5, wherein the EG region is electrically coupled to an erase line.

7. The NVM cell according to claim 1 further comprising a heavily doped region of the second conductivity type within the second OD region and adjacent to the floating gate extension.

8. The NVM cell according to claim 7 further comprising a lightly doped drain (LDD) region of the second conductivity type disposed within the second OD region between the shallow junction diffusion region and the heavily doped region.

9. The NVM cell according to claim 8, wherein the shallow junction diffusion region has a junction depth that is shallower than that of the heavily doped region.

10. The NVM cell according to claim 9, wherein the shallow junction diffusion region has a doping concentration that is smaller than that of the heavily doped region.

11. The NVM cell according to claim 10, wherein the heavily doped region has a doping concentration ranging between $5E14{\sim}2E15$ atoms/cm$^3$, the LDD region has a doping concentration ranging between $5E13{\sim}2E14$ atoms/cm$^3$, and the shallow junction diffusion region has a doping concentration ranging between $1E13{\sim}1E14$ atoms/cm$^3$.

12. The NVM cell according to claim 2, wherein the select transistor comprises a source doping region of the first conductivity type in the N well, a common doping region of the first conductivity type, a select gate channel region between the source doping region and the common doping region, a select gate overlying the select gate channel region, and a select gate dielectric layer between the select gate and the select gate channel region.

13. The NVM cell according to claim 12, wherein the source doping region is electrically coupled to a source line.

14. The NVM cell according to claim 12, wherein the floating gate transistor further comprising the common doping region, a drain doping region of the first conductivity type, a floating gate channel region between the common doping region and the drain doping region, and a floating gate dielectric layer between the floating gate and the floating gate channel region.

15. The NVM cell according to claim 14, wherein the drain doping region is electrically coupled to a bit line.

* * * * *